United States Patent

Shoji

[15] 3,686,545

[45] Aug. 22, 1972

[54] IMPROVEMENT IN A MECHANICAL FORCE-TO-ELECTRIC SIGNAL TRANSDUCER HAVING A LIQUID BODY PRESSING MEMBER

[72] Inventor: Masami Shoji, Takatsuki-City, Japan

[73] Assignee: Matsushita Electronics Corporation, Kadoma City, Osaka Prefecture, Japan

[22] Filed: Dec. 29, 1969

[21] Appl. No.: 888,226

[30] Foreign Application Priority Data

Dec. 27, 1968 Japan ..........................44/437

[52] U.S. Cl......317/235 R, 317/235 M, 317/235 UA, 317/234 N, 317/234 M, 29/588

[51] Int. Cl...........................H01l 11/00, H01l 15/00

[58] Field of Search...........317/234, 235, 5.4, 26, 31; 29/588, 589

[56] References Cited

UNITED STATES PATENTS

| | | | |
|---|---|---|---|
| 3,443,041 | 5/1969 | Kahng et al. | 317/235 X |
| 3,518,508 | 6/1970 | Yamashita et al. | 317/235 |
| 3,535,773 | 10/1970 | Bakker et al. | 317/234 X |
| 3,190,954 | 6/1965 | Pomerantz | 317/235 |
| 3,240,962 | 3/1966 | White | 317/235 |
| 3,241,011 | 3/1966 | Demille et al. | 317/234 |
| 3,458,778 | 7/1969 | Genzabella et al. | 317/235 |
| 3,566,459 | 3/1971 | Rindner et al. | 317/235 X |

OTHER PUBLICATIONS

IEEE Transactions on Electron Devices Dec. 1967, by Kano et al. pages 822 to 828.

*Primary Examiner*—John W. Huckert
*Assistant Examiner*—Andrew J. James
*Attorney*—Craig, Antonelli & Hill

[57] ABSTRACT

A pressure sensitive electric transducer including a solid-state device whose electric characteristics vary in response to application of an input pressing force to an operation area thereof by a rigid body pressing member in the form of a minute sphere. The pressure receiving area of the solid-state device is provided with a soft metal film and the rigid body pressing member is provided with a metal film capable of forming a eutectic alloy with the soft metal film on the surface of the solid-state device, the two metal films then being bonded together by thermo-compression bonding thereby bonding the minute sphere to the operation area of the solid-state device.

11 Claims, 4 Drawing Figures

INVENTOR
MASAMI SHOJI
BY
Craig, Antonelli, Stewart & Hill ATTORNEYS

IMPROVEMENT IN A MECHANICAL FORCE-TO-ELECTRIC SIGNAL TRANSDUCER HAVING A LIQUID BODY PRESSING MEMBER

BACKGROUND OF THE INVENTION

This invention relates to an electric transducer employing a solid-state device and designed to respond to an input mechanical pressing force. Particularly it relates to a device having a novel input mechanical force impressing means.

The conventional pressure-sensitive electric transducer is one which changes its current or generates an output signal in response to a mechanical pressing force applied to an operation area of the solid-state device, such as a semiconductor device constituted with a Pn junction or a metal-semiconductor barrier junction. However, such transducer devices are so constructed as to impart a concentrated force to a minute area in order to intensify the sensitivity to respond to the applied force. Therefore, the force-impressing mechanism of such devices is delicate and troublesome to construct. For example, one of the prior art examples is constructed, as illustrated in FIG. 1, with a pressing needle 33 made of a rigid material, such as tungsten wire, with a sharp point which is arranged to press upon an operation area 32 provided on a semiconductor substrate 31, formed of one of the known P or N type semiconductor materials. And, another example of the prior art is constructed, as illustrated in FIG. 2, with a pressing member 34 constituted of a minute rigid sphere in contact with an operation area 32 on a semiconductor substrate 31, and after it is bonded with a soft substance 35, such as an adhesive resin, the pressing member 34 is pressed down by a pressing lever 36. In the drawing, reference numeral 37 indicates an insulating film provided on the surface of the device.

These known devices are so designed to impart the concentrated pressure through the pressing member to the operation area which is no larger than tens of microns, and therefore the process to place the pressing member at a desired position of the bonding process is subject to much difficulty.

SUMMARY OF THE INVENTION

The present invention is intended to offer a desirable solution to the abovementioned problems, that is, primarily to obtain a transducer of high sensitivity, and secondly to present an electric transducer which is easy to manufacture.

A pressure-sensitive electric transducer of the present invention is a solid-state device designed to vary the electric characteristics of an operation area by applying an input pressing force to said operation area. Said operation area is an area which is made to receive and sensitive for an input pressing force, and can be constituted by, for instance, a P–N junction or a metal-semiconductor barrier (Schottky barrier) junction of a semiconductor device, or a pressure-sensitive surface of other solid-state device.

The pressure-sensitive electric transducer of the present invention if prepared, by installing a pressing means of rigid-body which is formed by providing the pressure receiving face of a solid-state device with a soft metal film, and providing the pressing surface of rigid body with a metal film, and then by bonding these two metal films together by thermo-compression bonding. By such constitution, even the minute rigid spherical body can be easily bonded to the face of the solid-state device and such manufacturing process is easy. Furthermore, as such device can be constituted to provide a minute rigid-body pressing means, it can concentrate an input pressing force on a minute junction area or operation area and thus can obtain a high sensitivity.

BRIEF DESCRIPTION OF THE DRAWING

The device of this invention is fully described hereunder by referring to the drawing, wherein.

DETAILED DESCRIPTION

Figure 1:
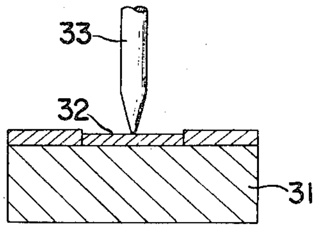
FIG. 1 (Prior Art)
FIG. 1 and FIG. 2 show partial sectional views of principal parts of respective known pressure-sensitive electric transducers mentioned above, FIG. 3 provides a sectional view of a principal part of an example of a pressure-sensitive electric transducer of the present invention, and FIG. 4 provides a plan view of the device shown in FIG. 3 in the finished state.
Figure 2:
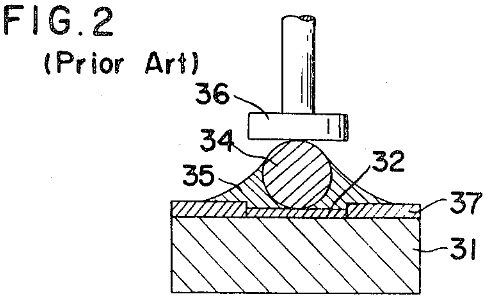
FIG. 2 (Prior Art)
Figure 3:
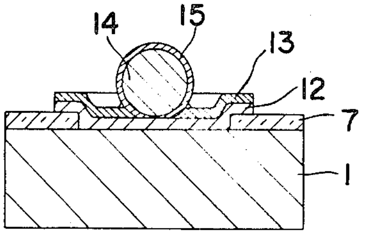

In FIG. 3, numeral 1 designates a starting substrate of a solid-state device, such as a semiconductor substrate of either P or N type, and numeral 12 indicates an operation layer which can be, for instance, a sputtered layer of a metal film of molybdenum forming a Schottky barrier on the face contacting said substrate 1. Also, this layer 12 can be a semiconductor layer having a conductivity different from that of the substrate and forming a PN junction therewith which is not deep from the operating surface and is formed between it and said substrate. Numeral 13 designates a metal electrode layer conductively bonded to said operation layer 12, and a film of gold, aluminum, copper or a soft metal such as lead-tin-solder, and so on, is chosen. Numeral 14 designates a core of the pressing member, which is the characteristic of this invention, and on the surface of which there is provided a metal layer 15 which can be alloyed by thermo-compression bonding with said metal electrode layer 13. As the core 14 of the pressing member, a spherical rigid body of diamond, ruby, sapphire, agate, quartz or glass is suitable. For a metal layer 15 to cover the core, aluminum, copper, gold or nickel can be chosen. Particularly for the metal layer 15, it is preferred to be selected from such metals that are to form an eutectic alloy with the metal electrode layer 13 at a low temperature. Examples of desirable combinations for such purpose are gold-aluminum, copper-aluminum, aluminum-nickel, gold-copper, gold-nickel, and so on, all of which have low eutectic alloying points of between 500°C and 1,000° C.

Figure 4:
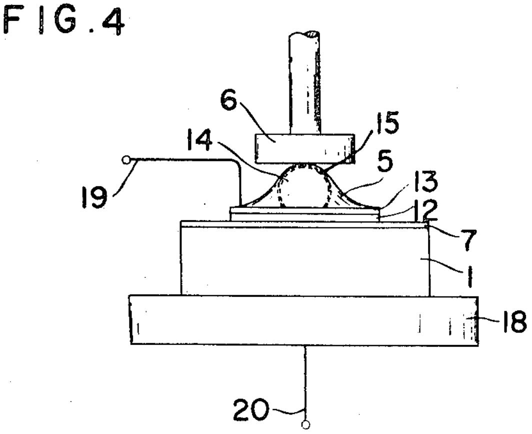

Methods of preparing this device are exemplified as follows. First, the surface of spherical rigid body core 14 is coated with said metal layer 15 by means of vacuum deposition, chemical deposition or non-electrolytic plating. Next, the electrode layer 13 and the metal layer 15 are bonded by catching the spherical body with a vacuum sucker and pressing it against said metal electrode layer 13 on the substrate which has been heated and kept at a specified temperature. Then said spherical body and principal part of said electrode layer 13 are bonded, as shown in FIG. 4, with an adhesive 5 of soft plastics or of rubber type. By the abovementioned formation, the pressing member core 14 can be stably bonded at a desired position by means of eutectic alloying by thermo-compression bonding, and accordingly the bonded position does not shift even when pressed by a pressing means 6, which is provided to press the core 14 of the pressing member. The device thus formed is placed on a metal support 18, as shown in FIG. 4, and is equipped with electrode lead-wires 19 and 20 and is completed as a two-terminal transducer.

The device of this invention made as above has a characteristic construction that the process of fixing the minute pressing member to the operation area of the semiconductor can be done very easily, and at the same time, a highly sensitive transducer is obtainable, since a very rigid body can be used as its pressing member.

Although the present invention has been described with reference to but a single embodiment, it is to be understood that the scope of the invention is not limited to the specific details thereof, but is susceptible of numerous changes and modifications as would be apparent to one with normal skill in the pertinent technology.

What is claimed is:

1. In a pressure-sensitive electric trans-ducer for impressing input forces upon a specified operation area of a solid-state device by way of a rigid body pressing means in such a manner that its output signals vary in accordance with the impressed input forces, the improvement comprising a first soft metal film covering said operation area and a second metal film covering at least the surface of said rigid-body pressing means adjacent said operation area, said rigid-body pressing means being provided in the form of a minute sphere of a material selected from a group consisting of diamond, ruby, sapphire, agate and quartz and being fixed onto the operation area of the solid-state device in substantially direct contact therewith through a eutectic alloy layer formed by said first and second metal films.

2. A pressure-sensitive electric transducer as defined in claim 1, wherein one metal selected from a group consisting of gold, aluminum, copper and lead-tin-solder is chosen as a material for said soft metal film, and one metal selected from a group consisting of aluminum, copper, gold and nickel, which is easy to form a eutectic alloy with said soft metal at a low temperature, is chosen as a material for said metal film to be provided on the rigid body pressing means.

3. A pressure sensitive electric transducer as defined in claim 2, wherein said soft metal film is gold.

4. A pressure sensitive electric transducer as defined in claim 3, wherein said metal film to be provided on the rigid body pressing means is aluminum.

5. A pressure sensitive electric transducer as defined in claim 3, wherein said metal film to be provided on the rigid body pressing means is copper.

6. A pressure sensitive electric transducer as defined in claim 3, wherein said metal film to be provided on the rigid body pressing means is nickel.

7. A pressure sensitive electric transducer as defined in claim 2, wherein said soft metal film is copper.

8. A pressure sensitive electric transducer as defined in claim 7, wherein said metal film to be provided on the rigid body pressing means is aluminum.

9. A pressure sensitive electric transducer as defined in claim 2, wherein said soft metal film is lead-tin-solder.

10. A pressure sensitive electric transducer as defined in claim 2, wherein said soft metal film is aluminum.

11. A pressure sensitive electric transducer as defined in claim 10, wherein said metal film to be provided on the rigid body pressing means is nickel.

* * * * *